United States Patent
Kitazawa et al.

(10) Patent No.: US 10,962,932 B2
(45) Date of Patent: Mar. 30, 2021

(54) TIME MEASUREMENT DEVICE, TIME MEASUREMENT METHOD, LIGHT-EMISSION-LIFETIME MEASUREMENT DEVICE, AND LIGHT-EMISSION-LIFETIME MEASUREMENT METHOD

(71) Applicant: HAMAMATSU PHOTONICS K.K., Hamamatsu (JP)

(72) Inventors: Ken Kitazawa, Hamamatsu (JP); Mitsunori Nishizawa, Hamamatsu (JP); Takashi Ito, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 334 days.

(21) Appl. No.: 15/508,195

(22) PCT Filed: Jul. 22, 2015

(86) PCT No.: PCT/JP2015/070858
§ 371 (c)(1),
(2) Date: Mar. 2, 2017

(87) PCT Pub. No.: WO2016/035469
PCT Pub. Date: Mar. 10, 2016

(65) Prior Publication Data
US 2017/0285579 A1    Oct. 5, 2017

(30) Foreign Application Priority Data
Sep. 3, 2014 (JP) .................. 2014-179391

(51) Int. Cl.
*G01N 21/64* (2006.01)
*G04F 10/00* (2006.01)
(Continued)

(52) U.S. Cl.
CPC ....... *G04F 10/005* (2013.01); *G01N 15/1431* (2013.01); *G01N 21/64* (2013.01);
(Continued)

(58) Field of Classification Search
CPC .......... G01N 21/6408; G01N 21/6402; G01N 21/6404; G01N 21/64; G01N 21/6428;
(Continued)

(56) References Cited

U.S. PATENT DOCUMENTS 6,522,395 B1 * 2/2003 Bamji ................. G01C 3/08
                                                   348/E3.018
8,786,474 B1   7/2014 Mann
(Continued)

FOREIGN PATENT DOCUMENTS

CN    103105383    5/2013
DE    102009040749  3/2011
(Continued)

OTHER PUBLICATIONS

International Preliminary Report on Patentability dated Mar. 16, 2017 for PCT/JP2015/070858.
(Continued)

*Primary Examiner* — David P Porta
*Assistant Examiner* — Mamadou Faye
(74) *Attorney, Agent, or Firm* — Faegre Drinker Biddle & Reath LLP

(57) ABSTRACT

A time measurement device for calculating a time from an input of a first trigger signal to an input of a second trigger signal as a measured time includes a start gate configured to generate a start signal, a stop gate configured to generate a stop signal, a TDC circuit configured to generate a digital code corresponding to the time from an input of a start signal to an input of a stop signal, a delay circuit configured to delay an input of at least one of the start signal and the stop
(Continued)

signal to the TDC circuit by a predetermined delay time, and a control unit configured to calculate a measured time on the basis of a plurality of digital codes generated by the TDC circuit, wherein the time delay unit selects at least two delay times.

13 Claims, 13 Drawing Sheets

(51) Int. Cl.
  *G04F 10/06* (2006.01)
  *G01N 15/14* (2006.01)
  *H03L 7/081* (2006.01)

(52) U.S. Cl.
  CPC ......... *G01N 21/6408* (2013.01); *G04F 10/06* (2013.01); *H03L 7/0818* (2013.01)

(58) Field of Classification Search
  CPC ........... G01N 21/6454; G01N 21/6456; G01N 21/6458; G01N 21/648; G01N 21/6486
  See application file for complete search history.

(56) References Cited

U.S. PATENT DOCUMENTS

| | | | | |
|---|---|---|---|---|
| 2006/0267812 | A1* | 11/2006 | Bunin | H03M 1/06 341/120 |
| 2008/0252280 | A1* | 10/2008 | Prodic | H03K 7/08 323/283 |
| 2011/0133973 | A1* | 6/2011 | Yamamoto | G01R 31/31709 341/166 |
| 2013/0119276 | A1 | 5/2013 | Widzgowski | |
| 2014/0055583 | A1* | 2/2014 | Kato | H04N 7/22 348/65 |
| 2015/0001399 | A1* | 1/2015 | Fries | G01T 1/2985 250/362 |

FOREIGN PATENT DOCUMENTS

| | | |
|---|---|---|
| JP | S62-9846 B2 | 3/1987 |
| JP | S63-3273 B2 | 1/1988 |
| JP | H04-503246 A | 6/1992 |
| JP | 2009-544973 A | 12/2009 |
| TW | 584793 B | 4/2004 |
| WO | WO-90/01692 A2 | 2/1990 |
| WO | WO-2008/079445 A2 | 7/2008 |
| WO | WO-2010/013385 A1 | 2/2010 |

OTHER PUBLICATIONS

Baldwin K M et al, "A 100-ps Time-Resolution CMOS Time-to-Digital Converter for Positron Emission Tomography Imaging Applications," IEEE Journal of Solid-State Circuits, IEEE Service Center, Piscataway, NJ, USA, vol. 39, No. 11, XP011120980, 2004, p. 1839-p. 1852.

W. Becker, "Advanced Time-Correlated Single Photon Counting Techniques", 2005.

* cited by examiner

*Fig.2*

| REAL TIME (ns) | 0 | 1 | 2 | 3 | 4 | 5 | 6 | 7 | 8 |
|---|---|---|---|---|---|---|---|---|---|
| IDEAL QUANTIZATION INTERVAL | |⎯|⎯|⎯|⎯|⎯|⎯|⎯|⎯| |
| DIGITAL CODE | | 000 | 001 | 010 | 011 | 100 | 101 | 110 | 111 |
| COUNT NUMBER | | ••• | ••• | ••• | ••• | ••• | ••• | ••• | ••• |

*Fig.3*

| REAL TIME (n sec) | 0 | 1 | 2 | 3 | 4 | 5 | 6 | 7 | 8 |

QUANTIZATION INTERVAL

DIGITAL CODE: 000 001 010 011 100 101 110 111

COUNT NUMBER

Fig.4

| REAL TIME (n sec) | 0 | 1 | 2 | 3 | 4 | 5 | 6 | 7 | 8 |

QUANTIZATION INTERVAL

DIGITAL CODE: 000 001 010 011 100 101 110 111

COUNT NUMBER: DELAY

TIME MEASUREMENT DEVICE, TIME MEASUREMENT METHOD, LIGHT-EMISSION-LIFETIME MEASUREMENT DEVICE, AND LIGHT-EMISSION-LIFETIME MEASUREMENT METHOD

TECHNICAL FIELD

An aspect of the present invention relates to a time measurement device, a time measurement method, a light-emission-lifetime measurement device, and a light-emission-lifetime measurement method.

BACKGROUND ART

In a light-emission-lifetime measurement device or the like for measuring a lifetime of light emission when excitation light is irradiated to a sample, a time measurement device that outputs information about a time difference between a start pulse signal and a stop pulse signal is used. As this time measurement device, a time measurement device using a time-digital-converter (TDC) scheme of measuring a time by outputting the time difference as a digital signal (for example, see Non-Patent Literature 1) is known. The TDC scheme is advantageous in that a measurement range is long and the cost is low as compared with a time-analog-converter (TAC) scheme of outputting the time difference as an analog signal.

CITATION LIST

Non-Patent Literature

[Non-Patent Literature 1] "Advanced Tune-Correlated Single Photon Counting Techniques" W. Becker (2005)

SUMMARY OF INVENTION

Technical Problem

In the time measurement device using the TDC scheme, a digital signal of a quantization interval corresponding to a real time from the output of the start pulse signal to the output of the stop pulse signal is output. However, it is difficult to set the quantization interval to a regular interval and it is difficult to make the real time and the quantization interval completely correspond to each other. The quantization interval varies (the influence of differential nonlinearity increases) and therefore a digital signal which does not properly correspond to a real time may be output. In this case, it may be impossible to sufficiently guarantee the accuracy of time measurement.

An aspect of the present invention has been made to solve the above-described problems and an objective of the invention is to provide a time measurement device, a time measurement method, a light-emission-lifetime measurement device, and a light-emission-lifetime measurement method capable of performing time measurement with high accuracy.

Solution to Problem

According to an aspect of the present invention, there is provided a time measurement device for calculating a time from an input of a first trigger signal to an input of a second trigger signal as a measured time, the time measurement device including: a first signal generation unit for generating a first signal in response to the first trigger signal; a second signal generation unit for generating a second signal in response to the second trigger signal; a digital conversion unit for receiving inputs of the first signal and the second signal and generating a digital signal corresponding to a time from the input of the first signal to the input of the second signal; a time delay unit for delaying an input of at least one of the first signal and the second signal to the digital conversion unit by a delay time selected from a plurality of preset delay times; and a time calculation unit for calculating the measured time on the basis of a plurality of digital signals, wherein the time delay unit selects at least two delay times.

In this time measurement device, at least one signal of the first signal and the second signal is delayed and the measured time which is the time from the input of the first trigger signal to the input of the second trigger signal is calculated on the basis of the plurality of digital signals generated from the time difference between the inputs of the first signal and the second signal. Therefore, delay times assigned to at least one signal of the first signal and the second signal are at least two different delay times. In general, because it is difficult to set the quantization interval according to digital conversion to a regular interval and there is a variation in the quantization interval, it is difficult to make a real time and a quantization interval completely correspond to each other and thereby the accuracy of the time measurement readily deteriorates. In this regard, in an aspect of the present invention, because the measured time is calculated from the plurality of digital signals according to the plurality of delay times, the variation of the quantization interval is smoothed according to the plurality of delay times even when there is a variation in the quantization interval and the time can be calculated from all of the plurality of digital signals with high accuracy. Thereby, according to an aspect of the present invention, time measurement can be performed with high accuracy.

Also, the time delay unit may delay the input of at least one of the first signal and the second signal to the digital conversion unit while chronologically switching the delay time selected from the plurality of delay times. Thereby, it is possible to sequentially assign a plurality of different delay times to at least one of the first signal and the second signal and it is possible to efficiently generate a plurality of digital signals according to a plurality of delay times. That is, it is possible to efficiently perform highly accurate time measurement.

Also, the time calculation unit may calculate the measured time by subtracting the delay time assigned to the digital signal from a time indicated by the digital signal. Thereby, it is possible to appropriately calculate a real time from which a delay time is subtracted while smoothing the variation of the quantization interval according to a plurality of digital signals according to the delay time.

Also, the digital conversion unit may receive inputs of a plurality of second signals for an input of one first signal and generate the digital signal for the input of each second signal. Thereby, it is possible to cope with a case in which a plurality of second trigger signals are input for one first trigger signal.

Also, the digital conversion unit may receive a plurality of inputs of signal pairs, each of which is a pair of the first signal and the second signal and generate the digital signal for each signal pair.

According to an aspect of the present invention, there is provided a time measurement method for calculating a time from an input of a first trigger signal to an input of a second trigger signal as a measured time, the time measurement method including: a step of generating a first signal in response to the first trigger signal; a step of generating a second signal in response to the second trigger signal; a step of receiving inputs of the first signal and the second signal by a digital conversion unit and generating a digital signal corresponding to a time from the input of the first signal to the input of the second signal; a step of delaying an input of at least one of the first signal and the second signal to the digital conversion unit by a delay time selected from a plurality of preset delay times; and a step of calculating the measured time on the basis of a plurality of digital signals, wherein at least two delay times are selected in the delaying step.

According to an aspect of the present invention, there is provided a light-emission-lifetime measurement device for measuring a lifetime of light emission emitted from a sample, the light-emission-lifetime measurement device including: a light source for outputting light to be irradiated to the sample; a trigger signal generation unit for outputting a first trigger signal corresponding to the output of the light; a photodetector for detecting light emission from the sample and outputting a detection signal as a second trigger signal; a time measurement device for calculating a time from an input of one trigger signal of the first trigger signal and the second trigger signal to an input of the other trigger signal as a measured time; and a calculation unit for calculating information about the lifetime of the light emission on the basis of the measured time, wherein the time measurement device includes: a first signal generation unit for receiving the one trigger signal and generating a first signal in response to the one trigger signal; a second signal generation unit for receiving the other trigger signal and generating a second signal in response to the other trigger signal; a digital conversion unit for receiving inputs of the first signal and the second signal and generating a digital signal corresponding to a time from the input of the first signal to the input of the second signal; a time delay unit for delaying an input of at least one of the first signal and the second signal to the digital conversion unit by a delay time selected from a plurality of preset delay times; and a time calculation unit for calculating the measured time on the basis of a plurality of digital signals, and wherein the time delay unit selects at least two delay times.

In this light-emission-lifetime measurement device, at least one of the first signal according to the first trigger signal corresponding to irradiation of light from the light source and the second signal according to the second trigger signal which is a detection signal of the light emission from the sample or at least one of the second signal according to the first trigger signal corresponding to irradiation of light from the light source and the first signal according to the second trigger signal which is a detection of light emission from the sample is delayed and the time measurement which is the time from the input of one trigger signal of the first trigger signal and the second trigger signal to the input of the other trigger signal is calculated on the basis of the plurality of digital signals generated from the time difference between the first signal and the second signal. Delay times assigned to at least one signal of the first signal and the second signal are at least two different delay times. Information about the lifetime of light emission is calculated on the basis of the measured time. Because the measured time is calculated from the plurality of digital signals according to the plurality of delay times, the variation of the quantization interval is smoothed according to the plurality of delay times even when there is a variation in the quantization interval and it is possible to calculate a time from all of the plurality of digital signals with high accuracy. Therefore, it is possible to calculate information about the lifetime of light emission emitted from the sample with high accuracy.

Also, the trigger signal generation unit may be a pulse generator for controlling an output of the light from the light source and outputting a control signal as the first trigger signal and the trigger signal generation unit may be a second photodetector for detecting the light from the light source and outputting a detection signal as the first trigger signal. Although various types of devices have been proposed for the light-emission-lifetime measurement device, the embodiment of the present invention can be applied to any type.

Also, the first trigger signal may be input to the second signal generation unit, and the second trigger signal may be input to the first signal generation unit. For example, if the lifetime of fluorescence light is measured, fluorescence light may not occur even when excitation light is irradiated. In this case, it may be impossible to perform time measurement if the first signal is output according to an output of the excitation light. Therefore, it is possible to prevent the time measurement from being impossible by setting the first signal as a signal according to detection of fluorescence light.

According to an aspect of the present invention, there is provided a light-emission-lifetime measurement method for measuring a lifetime of light emission emitted from a sample, the light-emission-lifetime measurement method including: a step of outputting light to be irradiated to the sample; a step of outputting a first trigger signal corresponding to the output of the light; a step of detecting light emission from the sample and outputting a detection signal as a second trigger signal; a step of calculating a time from an input of one trigger signal of the first trigger signal and the second trigger signal to an input of the other trigger signal as a measured time; and a step of calculating information about the lifetime of the light emission on the basis of the measured time, wherein the step of calculating the time as the measured time includes: a step of generating a first signal in response to the one trigger signal; a step of generating a second signal in response to the other trigger signal; a step of receiving inputs of the first signal and the second signal by a digital conversion unit and generating a digital signal corresponding to a time from the input of the first signal to the input of the second signal; a step of delaying an input of at least one of the first signal and the second signal to the digital conversion unit by a delay time selected from a plurality of preset delay times; and a step of calculating the measured time on the basis of a plurality of digital signals, and wherein at least two delay times are selected in the step of delaying.

Advantageous Effects of Invention

According to an aspect of the present invention, time measurement can be performed with high accuracy.

BRIEF DESCRIPTION OF DRAWINGS

FIG. 2 is a diagram illustrating an example of measurement results at ideal quantization intervals.

FIG. 3 is a diagram illustrating an example of measurement results when there is no delay time.

FIG. 4 is a diagram illustrating an example of measurement results when the delay time is 1 nsec.

DESCRIPTION OF EMBODIMENTS

Hereinafter, embodiments of a time measurement device, a time measurement method, a light-emission-lifetime measurement device, and a light-emission-lifetime measurement method according to aspects of the present invention will be described in detail with reference to the drawings.

First Embodiment

Figure 1:
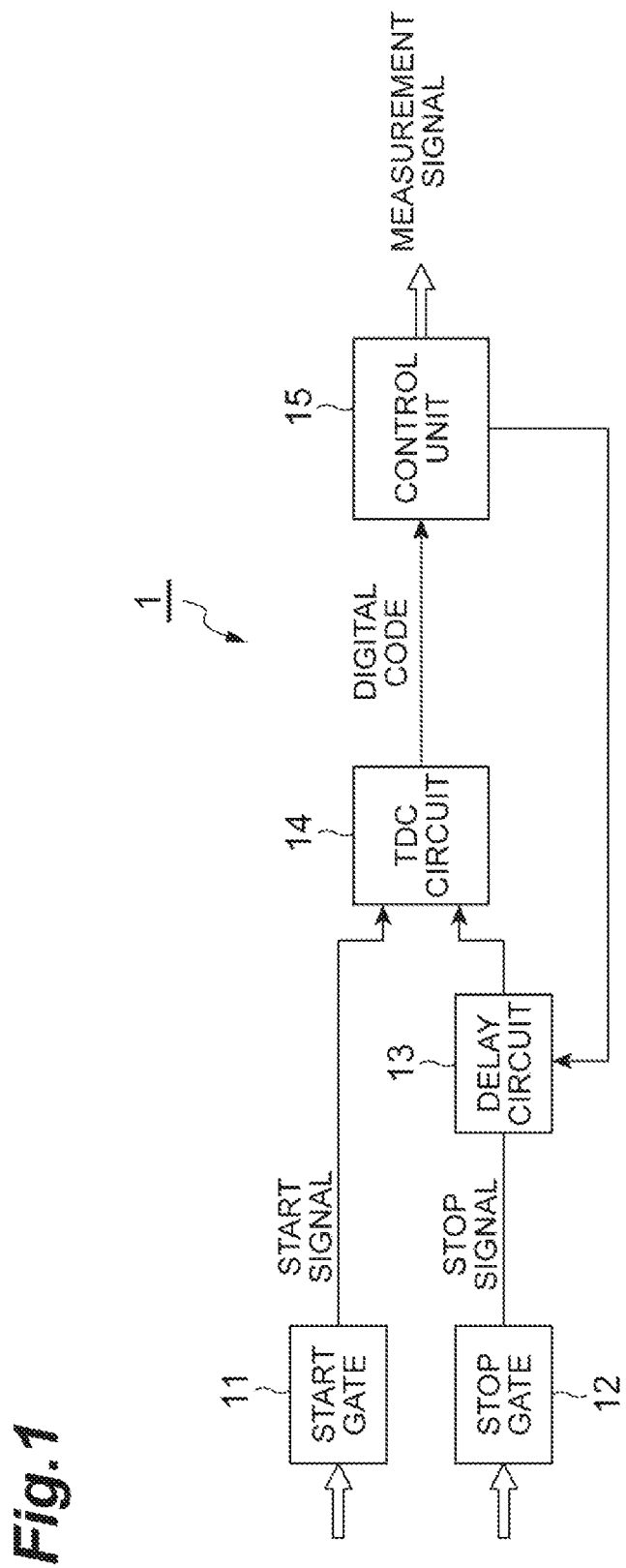
FIG. 1 is a diagram illustrating a time measurement device according to a first embodiment of the present invention.

FIG. 1 is a diagram illustrating a time measurement device according to the first embodiment of the present invention. The time measurement device 1 is a time measurement device that calculates a time from an input of a first trigger signal to an input of a second trigger signal as a measured time. The time measurement device 1 is applied to various devices and systems that calculate a difference between input timings of two signals from the two signals (the first trigger signal and the second trigger signal) input at different timings and can be applied to, for example, a light-emission-lifetime measurement device or the like for measuring a lifetime of light emission emitted from a sample. Details of an example applied to the light-emission-lifetime measurement device will be described in the second embodiment.

The time measurement device 1 includes a start gate 11 (a first signal generation unit), a stop gate 12 (a second signal generation unit), a delay circuit 13 (a time delay unit), a time-digital-convertor (TDC) circuit 14 (a digital conversion unit), and a control unit 15 (a time calculation unit).

The start gate 11 is a first signal generator that externally receives an input of a first trigger signal, generates a start signal (a first signal) in response to the first trigger signal, and outputs the start signal (the first signal) to the TDC circuit 14. The start signal is, for example, a pulse signal. The stop gate 12 is a second signal generator that externally receives a second trigger signal, generates a stop signal (a second signal) in response to the second trigger signal, and outputs the stop signal (the second signal) to the delay circuit 13. The stop signal is, for example, a pulse signal. The first trigger signal and the second trigger signal are continuously input as a pair to the time measurement device 1. Consequently, the start signal and the stop signal output as triggers of these signals are also continuously output in pairs. A time required until the start gate 11 outputs the start signal after receiving the first trigger signal and a time required until the stop gate 12 outputs the stop signal after receiving the second trigger signal may be substantially the same or may have a time difference of only a known time.

The delay circuit 13 receives the input of the stop signal from the stop gate 12 and delays the input of the stop signal to the TDC circuit 14 by one delay time selected from a plurality of preset delay times. The one delay time is set for each signal pair which is a pair of the start signal and the stop signal. The delay circuit 13 sets the one delay time assigned to at least two signal pairs among the plurality of signal pairs to different delay times. More specifically, the delay circuit 13 delays the stop signal while chronologically switching the plurality of delay times (delay amounts). Also, a delay time of 0 nsec (no delay time) may be included in the plurality of delay times. Such a plurality of delay times are predetermined by the control unit 15 and the chronological switching of the delay time is also controlled by the control unit 15. Also, the delay time is set to a time corresponding to a multiple of n (n is a positive integer) of the unit of the quantization interval (details will be described below). For example, if the control unit 15 sets the delay time to 1 nsec, the delay circuit 13 delays the input stop signal by 1 nsec after the input of the stop signal is received and then outputs the stop signal. Also, if the control unit 15 sets the delay time to 2 nsec, the delay circuit 13 switches the delay time to 2 nsec according to control of the control unit 15, delays the input stop signal by 2 nsec after the input of the stop signal is received, and then outputs the stop signal. Although the case in which the delay circuit 13 delays the stop signal will be described in this embodiment, it is only necessary for the delay circuit 13 to delay at least one of the start signal and the stop signal, the delay circuit 13 may delay the start signal by a predetermined delay time after the start signal is received from the start gate 11, or the delay circuit 13 may delay both the start signal and the stop signal.

Figure 5:
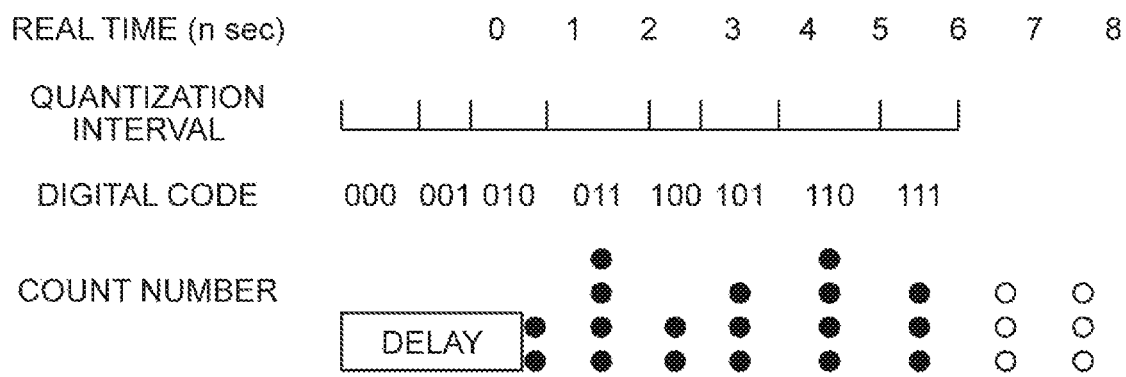
FIG. 5 is a diagram illustrating an example of measurement results when the delay time is 2 nsec.
Figure 6:
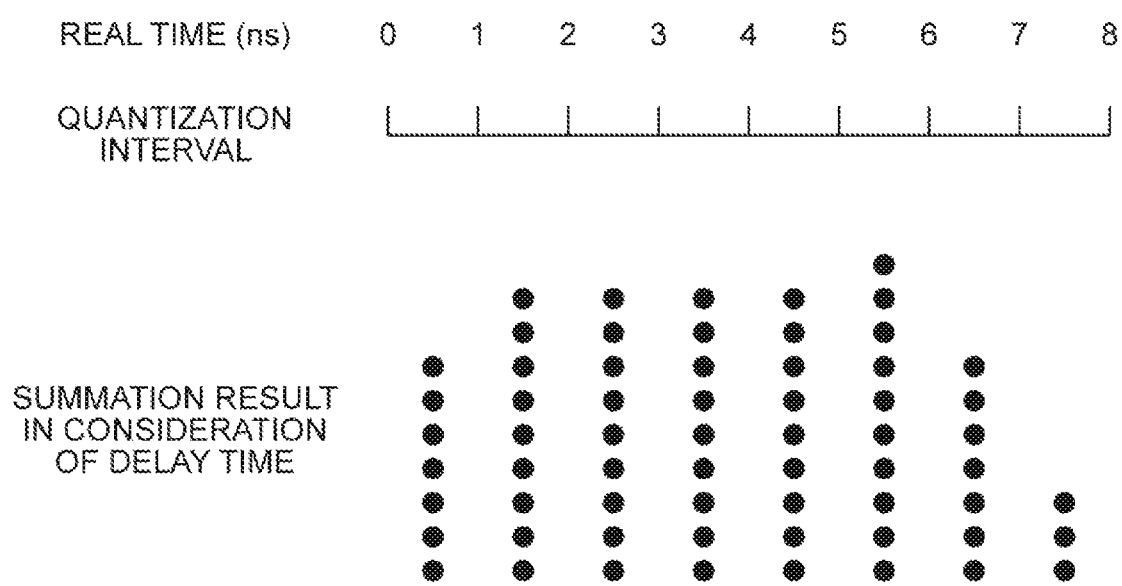
FIG. 6 is a diagram illustrating an example in which measurement results are summed.

The TDC circuit 14 is a digital converter that receives a plurality of inputs of signal pairs, each of which is a pair of the start signal and the stop signal, and outputs a digital code (a digital signal) corresponding to a time from the input of the start signal to the input of the stop signal on the basis of a predetermined quantization interval for each signal pair. The TDC circuit 14 generates and outputs a plurality of digital codes based on a predetermined quantization interval in consideration of the delay time of the stop signal delayed by the delay circuit 13. As the TDC circuit 14, there are a complementary metal oxide semiconductor (CMOS) type TDC circuit, a circuit obtained by combining a time-analog-converter (TAC) and an analog-digital-converter (ADC), and the like. The time measurement device 1 includes only one TDC circuit 14. Hereinafter, the output of the digital code from the TDC circuit 14 will be described with reference to FIGS. 2 to 6. FIG. 2 is a diagram illustrating an example of measurement results at ideal quantization intervals. FIG. 3 is a diagram illustrating an example of measurement results when there is no delay time. FIG. 4 is a diagram illustrating an example of measurement results when the delay time is 1 nsec. FIG. 5 is a diagram illustrating an example of the measurement results when the delay time is 2 nsec. FIG. 6 is a diagram illustrating an example in which measurement results are summed.

In the examples illustrated in FIGS. 2 to 6, the quantization interval of the TDC circuit 14 is set to 1 nsec, digital code 000 is set for 0 to 1 nsec, and digital code 001 is set for 1 to 2 nsec. Also, digital code 010 is set for 2 to 3 nsec and digital code 011 is set for 3 to 4 nsec. Digital code 100 is set for 4 to 5 nsec and digital code 101 is set for 5 to 6 nsec. Digital code 110 is set for 6 to 7 nsec and digital code 111 is set for 7 to 8 nsec. When a second trigger signal asynchronous to the first trigger signal is continuously input and when the quantization interval is constant (ideal quantization interval) as illustrated in FIG. 2, a count number of the digital code output from the TDC circuit 14 is assumed to have the same level for each time. However, due to various factors (for example, a factor of accuracy of an internal delay circuit when the TDC circuit 14 is of a CMOS type, a factor of accuracy of the analog circuit when the TDC circuit 14 is of a combination type of the TAC and the ADC, etc.), nonuniformity occurs in the quantization interval of the TDC circuit 14 (FIG. 3). For example, in FIG. 3, the quantization interval of digital code 011 is larger than the quantization interval of digital code 001. In this case, the count number of the digital code at each time which is the same when the quantization interval is uniform varies when the quantization interval does not become uniform as illustrated in FIG. 3. That is, the count number of digital code 011 having a relatively large quantization interval is smaller than the count number of digital code 001 having a relatively small quantization interval. As can be seen from the above, nonuniformity (differential nonlinearity) occurs in the quantization interval of the TDC circuit 14, so that the accuracy of the digital code to be output may decrease.

In this regard, the TDC circuit 14 generates digital codes according to a plurality of stop signals having different delay times, thereby ensuring the accuracy of the time measurement result finally output from the control unit 15. That is, as illustrated in FIG. 4, for example, the TDC circuit 14 outputs a digital code corresponding to the time from the input of the start signal to the input of the stop signal on the basis of the stop signal delayed by 1 nsec. Further, as illustrated in FIG. 5, the TDC circuit 14 outputs a digital code corresponding to the time from the input of the start signal to the input of the stop signal on the basis of the stop signal delayed by 2 nsec. Then, the control unit 15 can output a measurement signal in which the variation of the quantization interval is smoothed by summing the count numbers of the digital codes (FIGS. 3 to 5) of the same time in delay times (delay times of 0 nsec, 1 nsec, and 2 nsec). For example, if the real time is 0 to 1 nsec, the digital codes of the same time are digital code "000" (FIG. 3) in the delay time of 0 nsec, digital code "001" (FIG. 4) in the delay time of 1 nsec, and digital code "010" in the delay time of 2 nsec. That is, because the corresponding digital code is shifted by each of delay times, the count numbers of the digital codes are summed after the shift by the delay time.

As illustrated in FIG. 6, it can be confirmed that the count number of the digital code at each time summed in consideration of the delay time is substantially constant and the differential nonlinearity is remedied. Also, in terms of a time that cannot be measured by assigning the delay time, specifically, a real time of 7 to 8 nsec which cannot be measured when the delay time is 1 nsec or 2 nsec, and a real time of 6 to 7 nsec which cannot be measured when the delay time is 2 nsec, a correct count number is not provided due to an influence of a delay time.

Figure 7:
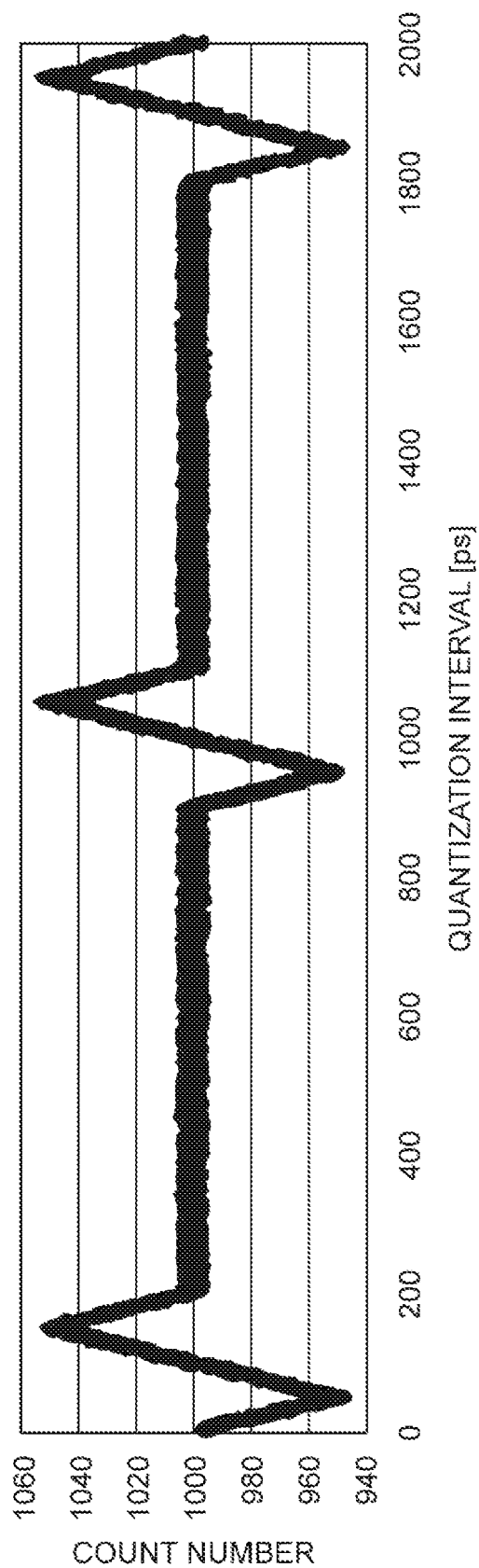
FIG. 7 is a graph illustrating the periodicity of differential nonlinearity.

The plurality of delay times described above are determined according to the periodicity of differential nonlinearity in the generation of the digital code by the TDC circuit 14. In other words, extents of an interval of each delayed stop signal and the number of delayed stop signals are determined according to the periodicity of the variation in the count number of the digital code (the periodicity of differential nonlinearity). FIG. 7 is a graph illustrating the periodicity of differential nonlinearity. In the example illustrated in FIG. 7, the quantization interval of the TDC circuit 14 is set to 1 psec and the second trigger signal asynchronous to the first trigger signal is continuously input so that the count number of the digital code is constant at each quantization interval if the quantization interval is constant (ideal quantization interval). As illustrated in FIG. 7, in practice, the count number of the digital code varies due to the nonuniformity of the quantization interval, a variation interval (cycle) is 900 psec, and a variation width is 200 psec. In this case, because it is only necessary to uniformly spread the variation of 200 psec within the cycle of 900 psec, it is only necessary to switch the delay 10 times, for example, at every 100 psec. That is, it is only necessary for the control unit 15 to set 10 stop signals at 100 psec intervals in the delay circuit 13. Also, because the variation has periodicity, a stop signal may be set to be delayed by one or more cycles or 10 stop signals at 1000 psec intervals may be set in the delay circuit 13.

Returning to FIG. 1, the control unit 15 calculates a measured time on the basis of a plurality of digital codes having different delay times and outputs a measurement result (measurement signal). The function of the control unit 15 can be implemented by a processor such as, for example, a field-programmable gate array (FPGA). As described above, the control unit 15 sums count numbers of digital codes after a shift by the delay time. That is, the control unit 15 subtracts the delay time assigned to the digital code from the time indicated by the input digital code. Then, the input digital code is converted into a digital code after the above-described subtraction. In this manner, the control unit 15 sums the count numbers of the digital codes after the conversion according to the delay time is performed. Also, the control unit 15 controls the change of the delay time of the delay circuit 13.

Figure 8:
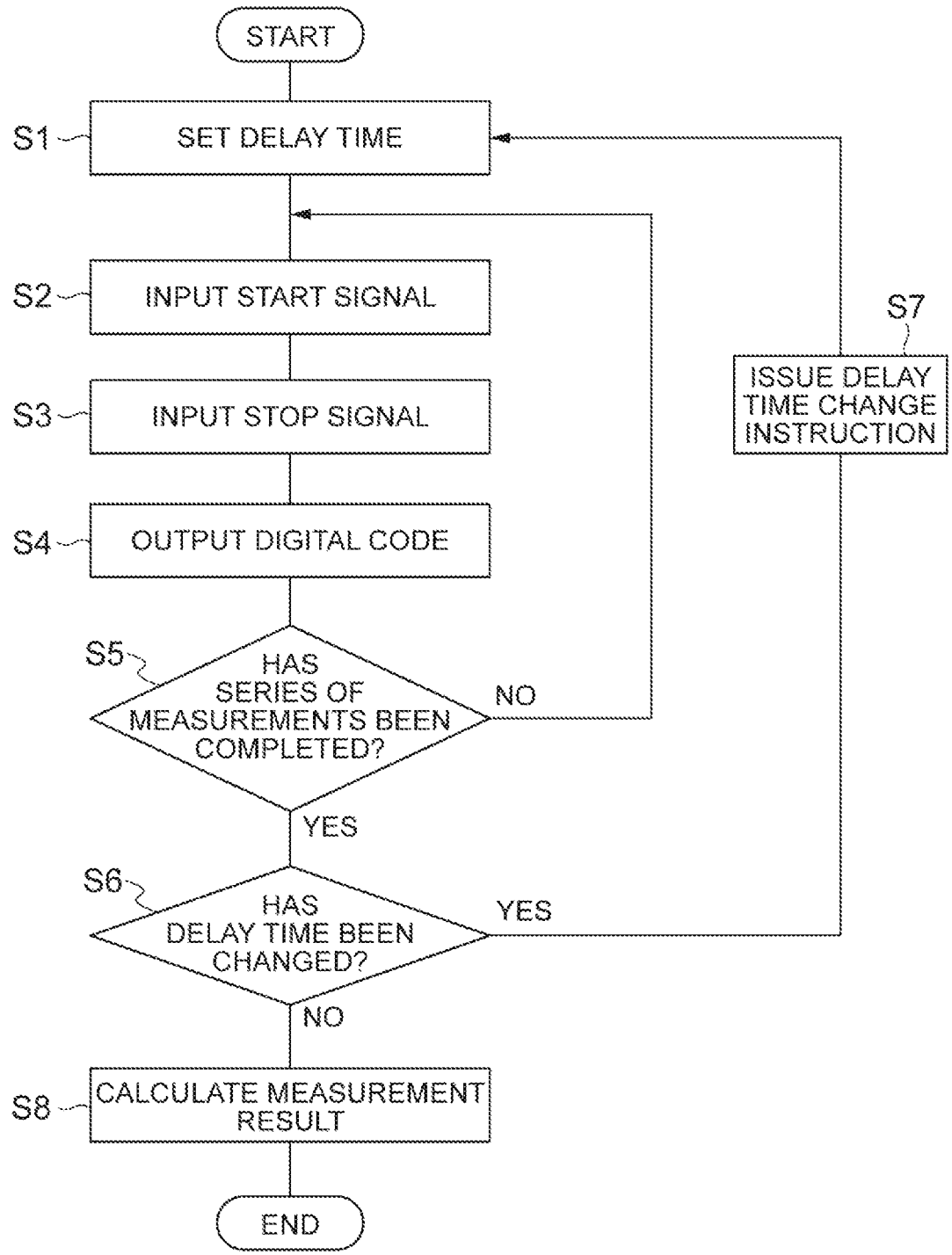
FIG. 8 is a flowchart illustrating a time measurement process of the time measurement device illustrated in FIG. 1.

Next, the processing flow of the time measurement device 1 will be described with reference to FIG. 8. FIG. 8 is a flowchart illustrating a time measurement process of the time measurement device illustrated in FIG. 1.

First, the control unit 15 sets a plurality of delay times for delaying the stop signal in the delay circuit 13 (step S1). The intervals of stop signals to be delayed and the number of stop signals are determined according to the periodicity of the variation in the count number of the digital code (the periodicity of the differential nonlinearity). As the first delay time, a delay time of 0 nsec is set so that the stop signal is not delayed. However, the delay time of 0 nsec may not necessarily be set.

Subsequently, a start signal according to the first trigger signal is input to the TDC circuit 14 by the start gate 11 (step S2). Thereafter, after a stop signal according to the second trigger signal is input to the delay circuit 13 by the stop gate 12 and is delayed by a delay time set by the delay circuit 13, the stop signal is input to the TDC circuit 14 (Step S3). Subsequently, the TDC circuit 14 outputs a digital code corresponding to the time from the input of the start signal to the input of the stop signal (step S4).

The number of iterations of the processing of S2 to S4 in the same delay time is preset and the control unit 15 determines whether or not the number of iterations has been reached (whether or not a series of measurements has been completed) (step S5). If it is determined that the number of iterations has not been reached in S5, the processing of S2 to S4 is iterated again. On the other hand, if it is determined that the number of iterations has been reached in S5, the control unit 15 determines whether or not to change the delay time (step S6).

If it is determined to change the delay time in S6, the control unit 15 instructs the delay circuit 13 to change the delay time (step S7). On the other hand, if the processing is completed for all the predetermined delay times and it is determined not to change the delay time in S6, the control unit 15 calculates and outputs a measurement result (measurement signal) on the basis of a plurality of digital codes having different delay times (step S8).

Next, the operation and effect of the time measurement device 1 according to the present embodiment will be described.

In the time measurement device 1, a stop signal of a signal pair including a start signal and the stop signal is delayed by a predetermined delay time, and a measured time which is a time from an input of a first trigger signal to an input of a second trigger signal is calculated on the basis of a plurality of digital codes generated from a time difference between the start signal and the stop signal in a plurality of signal pairs. Then, delay times assigned to at least two signal pairs among the signal pairs are delay times different from each other. In general, because it is difficult to set the quantization interval according to digital conversion to a regular interval and there is a variation in the quantization interval, it is difficult to make a real time and a quantization interval completely correspond to each other and thereby the accuracy of the time measurement readily deteriorates. In this regard, because the time measurement device 1 calculates the measured time from a plurality of digital codes according to a plurality of delay times k, the variation of the quantization interval is smoothed according to the plurality of delay times even when there is a variation in the quantization interval and the time can be calculated from all of the plurality of digital codes with high accuracy.

Also, because the delay circuit 13 delays the input of the stop signal to the TDC circuit 14 while chronologically switching one delay time selected from a plurality of delay times, it is possible to sequentially assign a plurality of different delay times to the stop signal and it is possible to efficiently generate a plurality of digital signals according to the plurality of delay times. That is, it is possible to efficiently perform highly accurate time measurement.

Also, the control unit 15 subtracts the delay time assigned to the digital code from the time indicated by the input digital code. Then, the control unit 15 converts the input digital code into the digital code after subtraction. In this manner, the control unit 15 sums count numbers of digital codes after the conversion according to the delay time is performed. Thereby, it is possible to appropriately calculate a real time from which a delay time is subtracted while smoothing the variation of the quantization interval according to a plurality of digital codes according to the delay time.

Also, the plurality of delay times are determined according to the periodicity of the differential nonlinearity in the generation of the digital signal by the TDC circuit 14. The differential nonlinearity has fixed periodicity and it is possible to effectively smooth the variation of the quantization interval by determining a plurality of delay times so that the variation of the quantization interval is spread across the entire cycle in consideration of the cycle of the differential nonlinearity.

Second Embodiment

Figure 9:
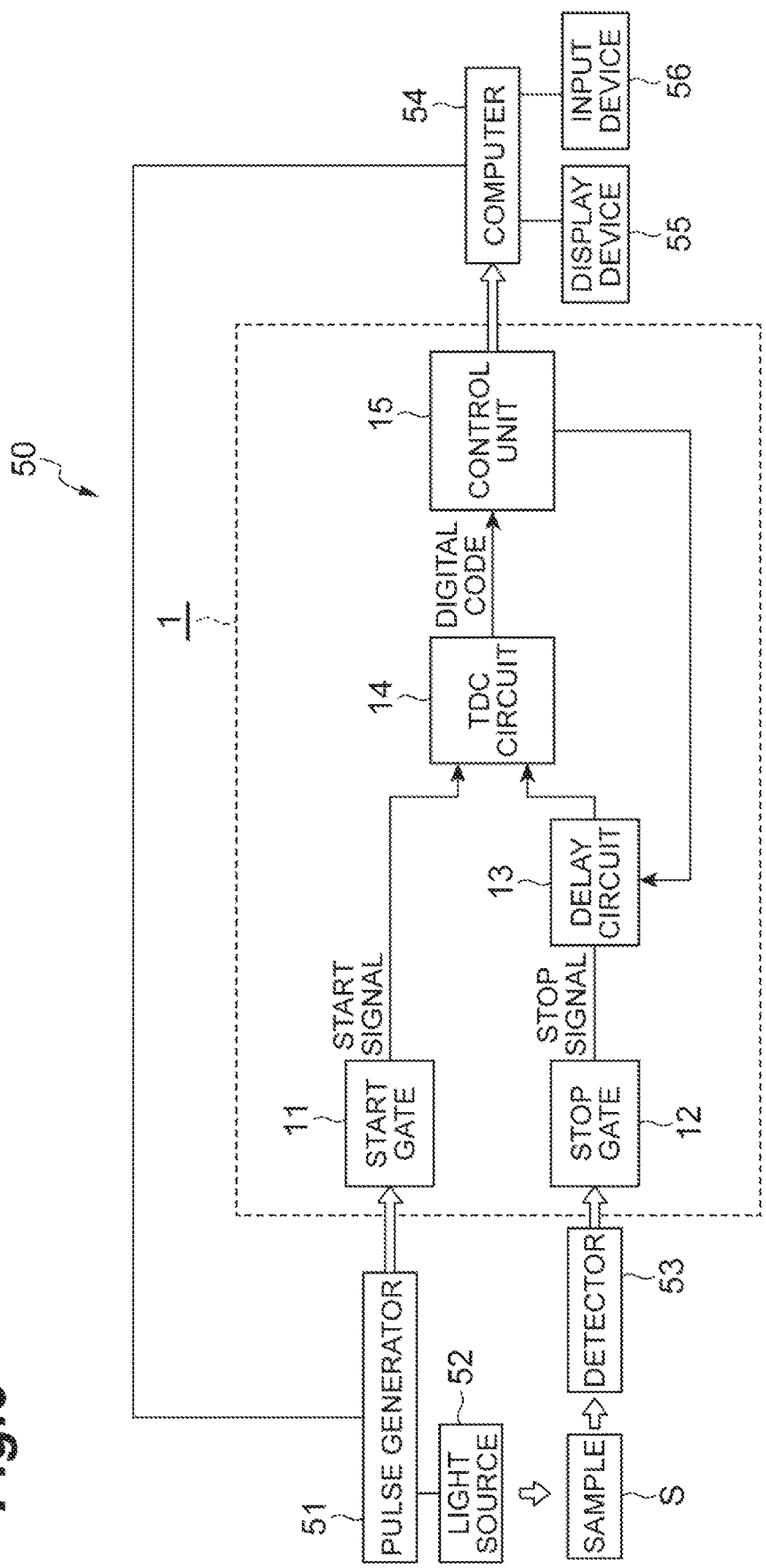
FIG. 9 is a diagram illustrating a light-emission-lifetime measurement device according to a second embodiment of the present invention.

Next, the light-emission-lifetime measurement device according to the second embodiment will be described with reference to FIG. 9. FIG. 9 is a diagram illustrating the light-emission-lifetime measurement device according to the second embodiment of the present invention. The light-emission-lifetime measurement device 50 is an application example to which the time measurement device 1 according to the first embodiment is applied, and is a device that measures the lifetime of light emission emitted from a sample S.

Fluorescence spectra of organic materials and/or fluorescent probes are important parameters for controlling and evaluating a function and/or characteristics of the sample such as a peak wavelength and a fluorescence intensity. However, because temporally integrated information is acquired in a fluorescence spectrum, when a plurality of substances or reaction systems are included in the sample, only information in which they are integrated can be obtained. In this case, as a means for evaluating the function or characteristics of the sample, the light-emission-lifetime measurement in which a time until the sample returns to a base state after being excited by pulse light is measured in a time domain from sub-nanoseconds to milliseconds is effective. In the light-emission-lifetime measurement device, the detection timing of the light emission is calculated on the basis of a start signal output on the basis of a pulse signal from a pulse generator and light emission (fluorescence, phosphorescence, and/or the like) output from a sample receiving excitation light output from a light source on the basis of the pulse signal. Then, a frequency distribution of detection timings is obtained by detecting the light emission a plurality of times and the light emission lifetime of the sample is estimated on the basis of the frequency distribution.

As illustrated in FIG. 9, the light-emission-lifetime measurement device 50 includes a time measurement device 1, a pulse generator 51 (a trigger signal generation unit), a light source 52, a photodetector 53, a computer 54 (a calculation unit), a display device 55, and an input device 56. The time measurement device 1 has the same configuration as that of the first embodiment. That is, the time measurement device 1 is configured to include a start gate 11, a stop gate 12, a delay circuit 13 (a time delay unit), a TDC circuit 14 (a digital conversion unit), and a control unit 15 (a time calculation unit).

The pulse generator 51 is a trigger signal generator that outputs pulse signals (first trigger signals) having the same timing to the light source 52 and the start gate 11 on the basis of an instruction from the computer 54. The pulse generator 51 controls the output of light from the light source 52 and outputs a control signal as the pulse signal (the first trigger signal). The start gate 11 outputs a start signal to the TDC circuit 14 on the basis of the pulse signal. Because pulse signals of the same timing are input to the light source 52 and the start gate 11, the start signal output from the start gate 11 is a signal corresponding to irradiation of light (excitation light) from the light source 52.

The light source 52 outputs the excitation light to be irradiated to the sample S on the basis of the above-described pulse signal output from the pulse generator 51. A light emitting diode (LED) light source, a laser light source, a super luminescent diode (SLD) light source, a lamp system light source, or the like can be used as the light source 52. The intensity of the excitation light is set, for example, to the extent that one photon is emitted when the sample S is irradiated with the excitation light. From the sample S irradiated with the excitation light, light emission (fluorescence, phosphorescence, and/or the like) according to the excitation light is output.

The photodetector 53 detects light emission and outputs a detection signal (a second trigger signal) to the stop gate 12. A photomultiplier tube, an avalanche photodiode, a PIN photodiode, or the like can be used as the photodetector 53. The stop gate 12 outputs a stop signal to the delay circuit 13 on the basis of a detection signal from the photodetector 53. The functions of the delay circuit 13, the TDC circuit 14, and the control unit 15 are the same as described in the first embodiment. That is, the delay circuit 13 delays the stop signal by a predetermined delay time and outputs the delayed stop signal to the TDC circuit 14. Also, the TDC circuit 14 outputs a digital code corresponding to a time from an input of the start signal to an input of the stop signal. Then, the control unit 15 calculates the time on the basis of a plurality of digital codes having different delay times. The control unit 15 outputs a measurement result which is the calculated time to the computer 54.

The computer 54 calculates (analyzes) information about the light emission lifetime on the basis of the measurement result output from the time measurement device 1 (more specifically, the control unit 15). Specifically, a processor included in the computer 54 derives the frequency distribution of the detection timings of light emission from the digital code (detection timing of light emission) of the stop signal included in the measurement result and executes a function of obtaining information about the light emission lifetime such as a light-emission-lifetime value and/or a component ratio of the sample S and an intensity distribution on the time axis from the frequency distribution. The function of the control unit 15 of the time measurement device 1 may be performed by the computer 54. In this case, the computer 54 receives the digital code from the TDC circuit 14 of the time measurement device 1. Then, the processor included in the computer 54 executes the function of the control unit 15 that calculates the time on the basis of a plurality of digital codes having different delay times.

The display device 55 is a display electrically connected to the computer 54 and displays a light-emission-lifetime analysis result of the above-described sample S. The input device 56 is a keyboard, a mouse, or the like, and can input and set analysis conditions and/or measurement conditions of a light emission lifetime.

Figure 10:
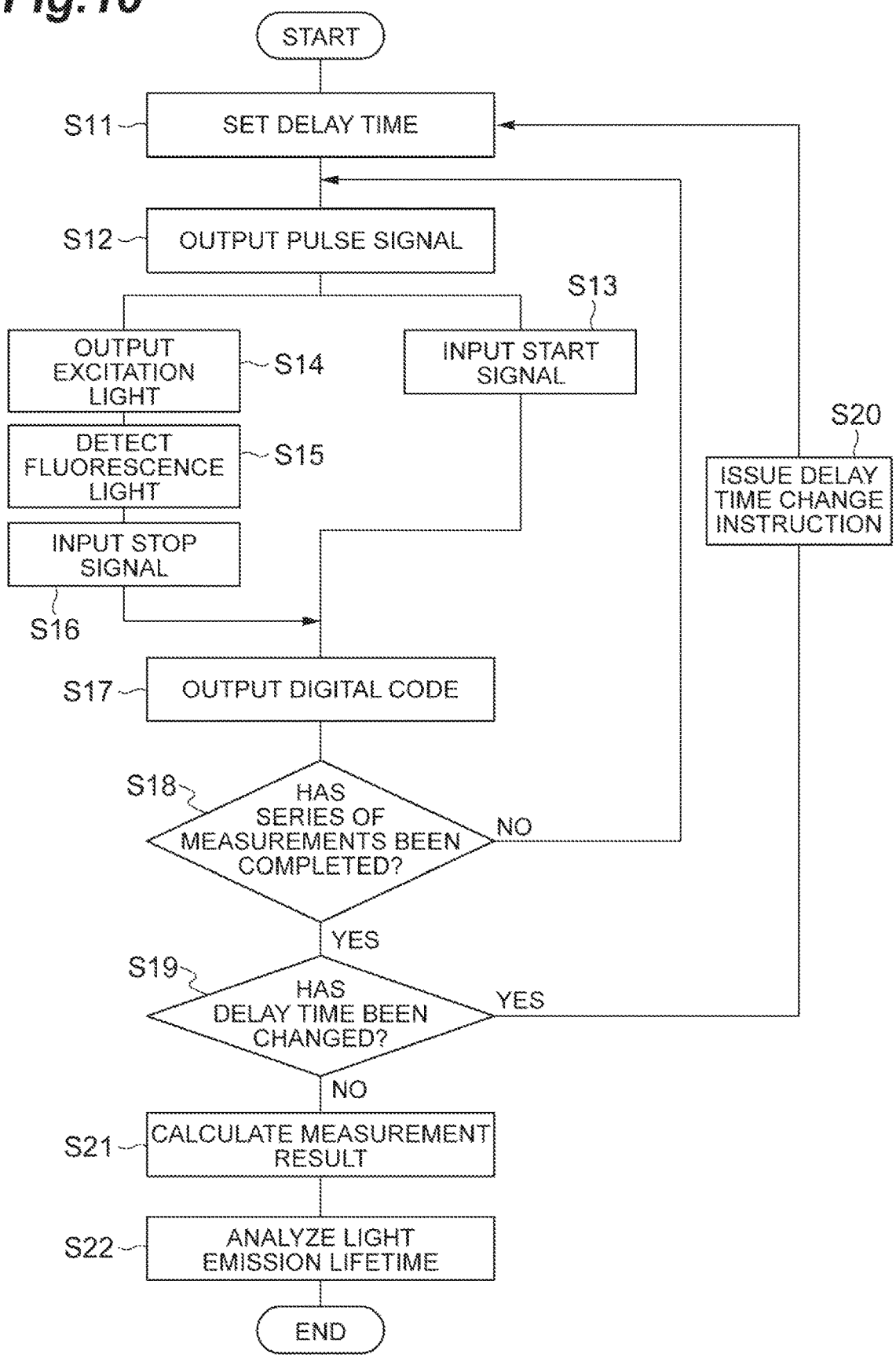
FIG. 10 is a flowchart illustrating a light-emission-lifetime measurement process of the light-emission-lifetime measurement device illustrated in FIG. 9.

Next, the processing flow of the light-emission-lifetime measurement device 50 will be described with reference to FIG. 10. FIG. 10 is a flowchart illustrating the light-emission-lifetime measurement process of the light-emission-lifetime measurement device illustrated in FIG. 9.

First, the control unit 15 sets a plurality of delay times for delaying the stop signal in the delay circuit 13 (step S11). Subsequently, pulse signals are output to the light source 52 and the start gate 11 by the pulse generator 51 (step S12). On the basis of the pulse signals, a start signal is output from the start gate 11 to the TDC circuit 14 (step S13) and excitation light to be irradiated to the sample S is output from the light source 52 (step S14).

Then, light emission (fluorescence, phosphorescence, and/or the like) generated from the sample S is detected by the photodetector 53 (step S15), and a detection signal is output from the photodetector 53. Subsequently, a stop signal is output from the stop gate 12 on the basis of the detection signal, the stop signal is input to the delay circuit 13 and the stop signal is input to the TDC circuit 14 after being delayed by the delay time set by the delay circuit 13 (step S16). Subsequently, the TDC circuit 14 outputs a digital code corresponding to a time from the input of the start signal to the input of the stop signal (step S17).

The number of iterations of the processing of S12 to S17 in the same delay time is preset and the control unit 15 determines whether or not the number of iterations has been reached (whether or not a series of measurements has been completed) (step S18). If it is determined that the number of iterations has not been reached in S18, the processes of S12 to S17 are iterated again. On the other hand, if it is determined that the number of iterations has been reached in S18, the control unit 15 determines whether or not to change the delay time (step S19).

If it is determined to change the delay time in S19, the control unit 15 instructs the delay circuit 13 to change the delay time (step S20). On the other hand, if the processing is completed for all the predetermined delay times and it is determined not to change the delay time in S19, the control unit 15 calculates and outputs a measurement result on the basis of delay times corresponding to the plurality of obtained digital codes (step S21). Then, the computer 54 calculates (analyzes) information about the light emission lifetime of the sample on the basis of the measurement result (step S22).

In this light-emission-lifetime measurement device 50, a stop signal of a signal pair including a start signal according to a first trigger signal serving as a trigger for light irradiation by the light source 52 and the stop signal according to a second trigger signal that is a detection signal of light emission from the sample S is delayed by a predetermined delay time and a measured time that is a time from the input of the first trigger signal to the input of the second trigger signal is calculated on the basis of a plurality of digital codes generated from a time difference between the start signal and the stop signal in a plurality of signal pairs. Also, the delay times assigned to at least two signal pairs among the signal pairs are different from each other. Then, information about the lifetime of the light emission is calculated on the basis of the measured time. Because the measured time is calculated from the plurality of digital signals according to the plurality of delay times, the variation of the quantization interval is smoothed by the plurality of delay times even when there is a variation in the quantization interval and the time can be calculated from all of the plurality of digital signals with high accuracy. Thereby, it is possible to calculate information about the lifetime of the light emission emitted from the sample S with high accuracy.

Figure 11:
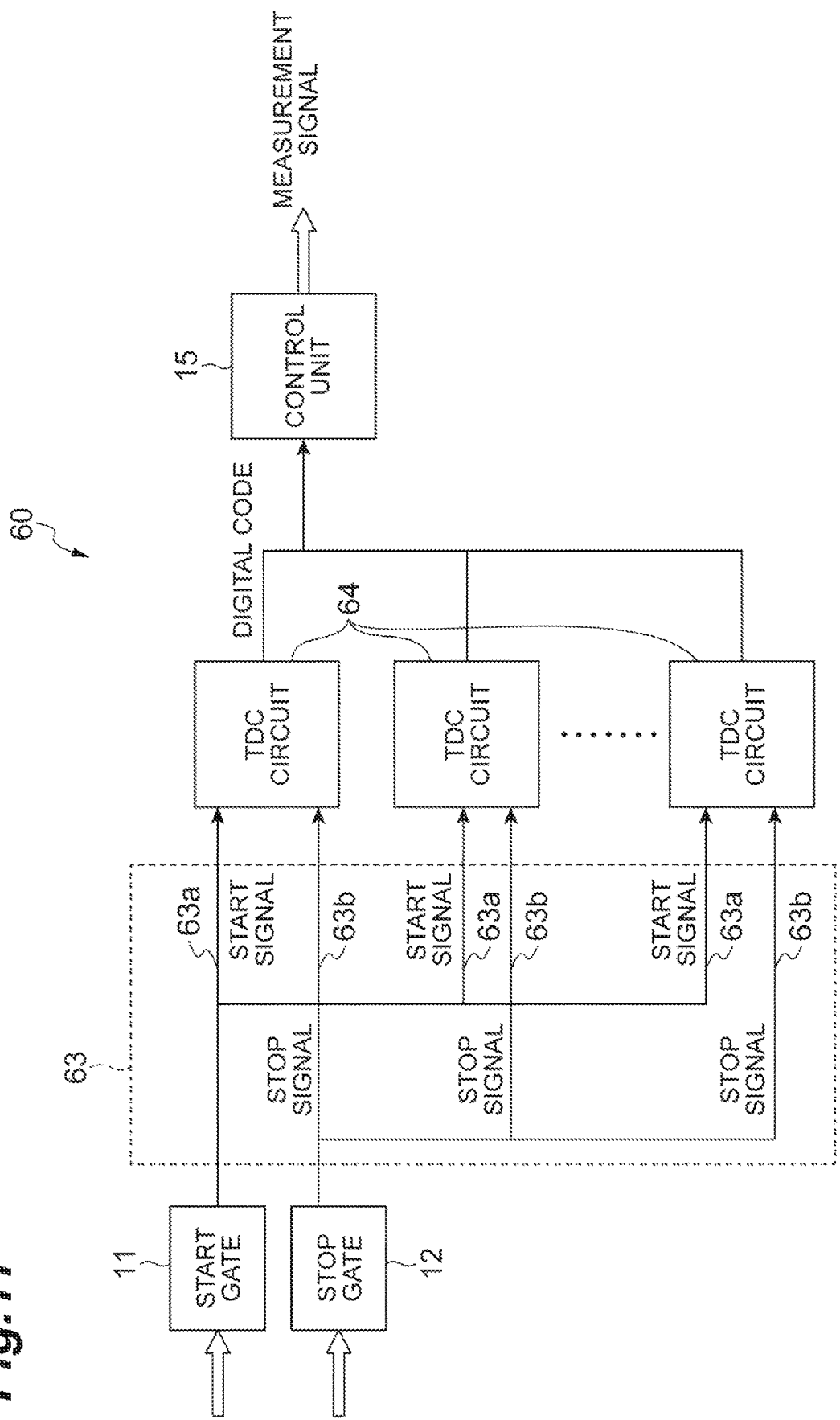
FIG. 11 is a diagram illustrating a time measurement device according to a modified example.
Figure 12:
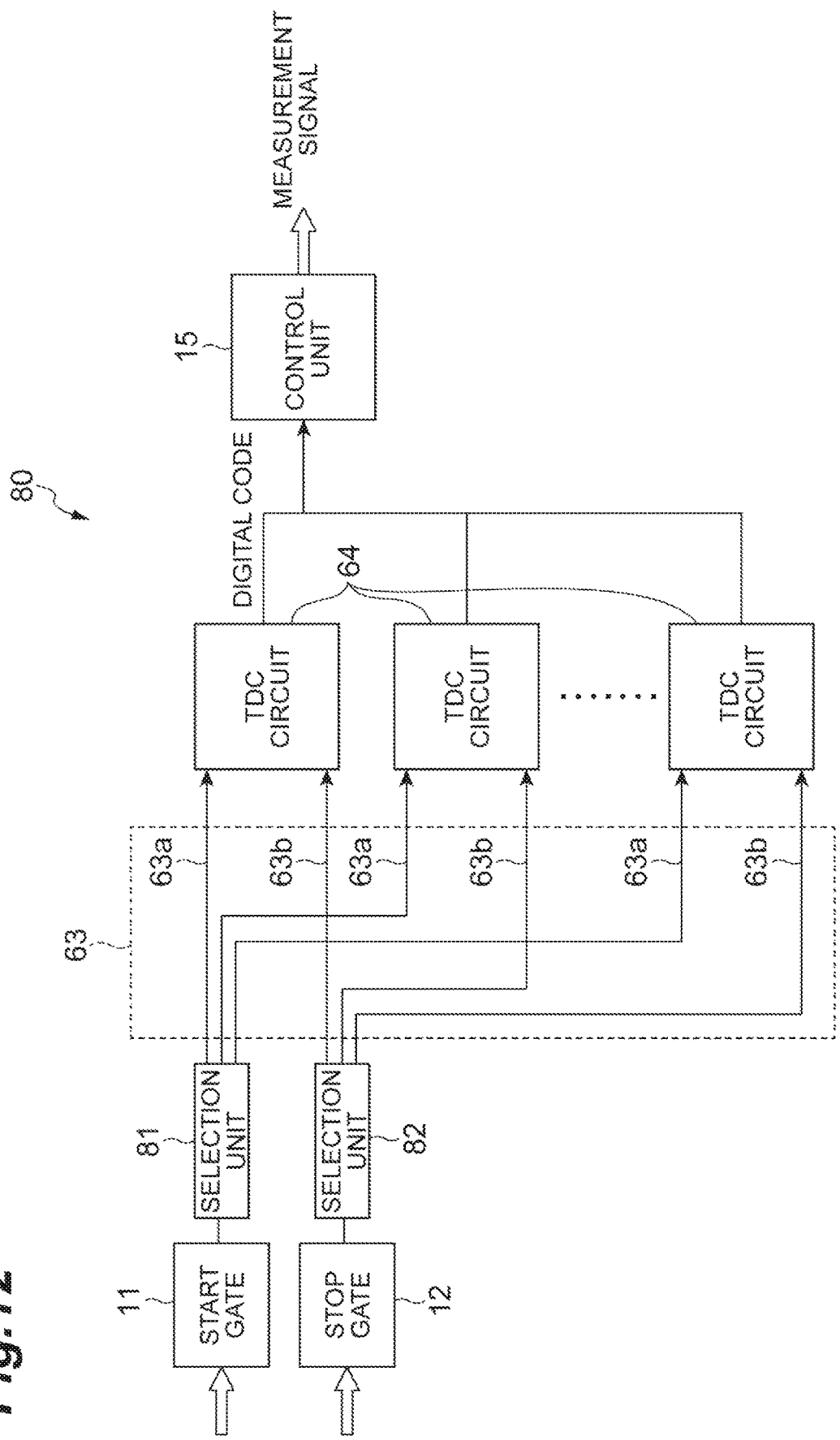
FIG. 12 is a diagram illustrating a time measurement device according to a modified example.

Although the embodiment according to an aspect of the present invention has been described above, the present invention is not limited to the above embodiment. For example, although the time measurement device 1 is described as including only one TDC circuit 14, the present invention is not limited thereto. That is, the digital conversion unit may be constituted of a plurality of TDC circuits (digital converters). Hereinafter, an example in which the digital conversion unit is constituted of a plurality of TDC circuits will be described with reference to FIGS. 11 and 12. FIGS. 11 and 12 are diagrams illustrating a time measurement device according to a modified example.

In the time measurement device 60 illustrated in FIG. 11, a plurality of TDC circuits 64 which receive inputs of a start signal from the start gate 11 and a stop signal from the stop gate 12 are provided. The start gate 11 and each TDC circuit 64 are electrically connected by a wire 63*a* and the length of each wire 63*a* is made different according to a distance between the start gate 11 and the TDC circuit 64. The stop gate 12 and each TDC circuit 64 are electrically connected by a wire 63*b*, and the length of each wire 63*b* is made different according to the distance between the stop gate 12 and the TDC circuit 64. In this manner, by making the lengths of the wires 63a and 63b different for each TDC circuit 64, it is possible to assign a time difference (delay time) to the signal input to each TDC circuit 64. Because the start signal and the stop signal can be delayed according to the lengths of the wires 63a and 63b, the wires 63a and 63b function as a time delay unit. In this manner, a configuration including a plurality of TDC circuits 64 is made, a delay time is assigned according to the lengths of the wires 63a and 63b, and each TDC circuit 64 outputs a digital code according to a different delay time, so that it is possible to simultaneously output digital codes having different delay times and enable quick time measurement to be performed.

As in the time measurement device 80 illustrated in FIG. 12, a selection unit 81 that selects the TDC circuit 64 to which the start signal is input and a selection unit 82 that selects the TDC circuit 64 to which the stop signal is input are configured to be further included in addition to the configuration of the time measurement device 60 illustrated in FIG. 11. Also, in the time measurement device 80, the delay time is determined according to the lengths of the wires 63a and 63b as in the time measurement device 60 of FIG. 11.

Figure 13:
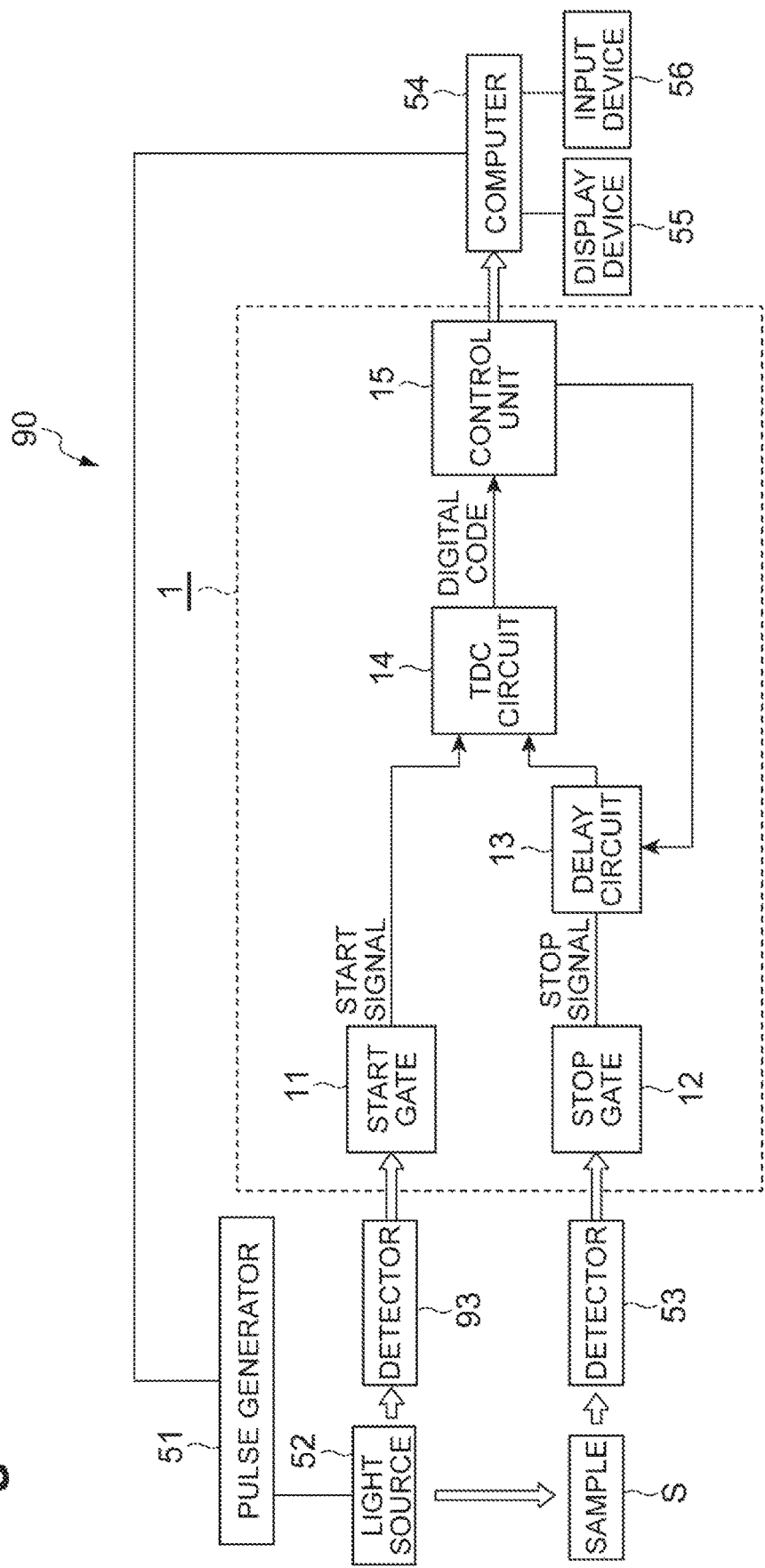
FIG. 13 is a diagram illustrating a light-emission-lifetime measurement device according to a modified example.

Also, although a configuration in which the pulse signal (the first trigger signal) is output from the pulse generator 51 to the start gate 11 in the light-emission-lifetime measurement device 50 illustrated in FIG. 9 is made, the present invention is not limited to this configuration. As in the light-emission-lifetime measurement device 90 illustrated in FIG. 13, a photodetector 93 (a trigger signal generation unit or a second photodetector) that detects excitation light output from the light source 52 may be configured to be separately provided and output the pulse signal (the first trigger signal) from the photodetector 93 to the start gate 11. In this case, the photodetector 93 serves as a trigger signal generator which outputs the pulse signal (the first trigger signal) corresponding to an output of light from the light source 52 to the start gate 11. Also, a photomultiplier tube, an avalanche photodiode, a PIN photodiode or the like can be used as the photodetector 93. Also, the photodetector 53 and the photodetector 93 used may be the same as each other.

Also, although a configuration in which the pulse signal (the first trigger signal) is output from the pulse generator 51 to the start gate 11 and the pulse signal is output from the photodetector 53 to the stop gate 12 has been made in the light-emission-lifetime measurement device 50 illustrated in FIG. 9, a configuration in which the pulse signal is output from the photodetector 53 to the start gate 11 and the pulse signal is output from the pulse generator 51 to the stop gate 12 may be adopted. Of course, also in the light-emission-lifetime measurement device 90 illustrated in FIG. 13, a configuration in which the pulse signal is output from the photodetector 53 to the start gate 11 and the pulse signal is output from the photodetector 93 to the stop gate 12 may be adopted. In this case, the start signal (the first signal) is output from the start gate 11 in accordance with the pulse signal (the first trigger signal) output from the photodetector 53. Also, the stop signal (the second signal) is output from the stop gate 12 in accordance with the pulse signal (the second trigger signal) accompanying an output of light from the light source 52.

Further, although the pulse signal from the pulse generator 51 or the photodetector 53 or 93 is converted into the start signal or the stop signal via the start gate 11 or the stop gate 12, the pulse signal from the pulse generator 51 or the photodetector 53 or 93 may be used as the start signal or the stop signal as it is and may be input to the delay circuit 13 or the TDC circuit 14.

Also, although a digital converter that receives a plurality of inputs of signal pairs, each of which is a pair of a start signal and a stop signal and outputs a digital code (a digital signal) corresponding to a time from an input of the start signal to an input of the stop signal on the basis of a predetermined quantization interval for each signal pair has been described as the TDC circuit 14, the TDC circuit 14 may be configured to receive a plurality of stop signals for one start signal. In this case, the TDC circuit 14 outputs a plurality of digital codes (digital signals) corresponding to times from an input of the start signal to inputs of the stop signals.

REFERENCE SIGNS LIST 1, 60, 80 Time measurement device
11 Start gate
12 Stop gate
13 Delay circuit
14 TDC circuit
15 Control unit
50 Light-emission-lifetime measurement device
51 Pulse generator
52 Light source
53 Photodetector
54 Computer
S Sample

The invention claimed is:

1. A light-emission-lifetime measurement device for measuring a lifetime of light emission emitted from a sample, the light-emission-lifetime measurement device comprising:
a light source configured to output light to be irradiated to the sample;
a trigger signal generator configured to output a first trigger signal corresponding to the output of the light;
a photodetector configured to detect light emission from the sample and output a detection signal as a second trigger signal;
a time measurement device configured to calculate a time from an input of one trigger signal of the first trigger signal and the second trigger signal to an input of the other trigger signal as a measured time; and
a calculator configured to calculate information about the lifetime of the light emission based on the measured time,
wherein the time measurement device comprises:
a first signal generator configured to receive the one trigger signal and generate a first signal in response to the one trigger signal;
a second signal generator configured to receive the other trigger signal and generate a second signal in response to the other trigger signal;
a time digital converter configured to receive a plurality of inputs of signal pairs, each of which is a pair of the first signal and the second signal, and output a digital code corresponding to a time from the input of the first signal to the input of the second signal on the basis of a predetermined quantization interval for each signal pair;
a time delay circuit configured to delay an input of at least one of the first signal and the second signal to the time digital converter by a delay time selected from a plurality of preset delay times; and a time calculator configured to calculate the measured time based on a plurality of digital codes, wherein the time delay circuit is configured to select at least two delay times, and wherein the time calculator is configured to count a count number of each of the digital codes for each of the delay times, and sum up the count numbers of the digital codes having the same real time in consideration of the delay times.

2. The light-emission-lifetime measurement device according to claim 1, wherein the trigger signal generator comprises a pulse generator configured to control an output of the light from the light source and output a control signal as the first trigger signal.

3. The light-emission-lifetime measurement device according to claim 1, wherein the trigger signal generator comprises a second photodetector configured to detect the light from the light source and output a detection signal as the first trigger signal.

4. The light-emission-lifetime measurement device according to claim 1, wherein the first trigger signal is input to the second signal generator, and wherein the second trigger signal is input to the first signal generator.

5. A light-emission-lifetime measurement method for measuring a lifetime of light emission emitted from a sample, the light-emission-lifetime measurement method comprising:

outputting light to be irradiated to the sample;

outputting a first trigger signal corresponding to the output of the light;

detecting light emission from the sample and outputting a detection signal as a second trigger signal;

generating a first signal in response to the one trigger signal;

generating a second signal in response to the other trigger signal;

receiving a plurality of inputs of signal pairs, each of which is a pair of the first signal and the second signal, by a time digital converter and outputting a digital code corresponding to a time from the input of the first signal to the input of the second signal on the basis of a predetermined quantization interval for each signal pair;

selecting at least two delay times from a plurality of preset delay times;

delaying an input of at least one of the first signal and the second signal to the time digital converter based on the selected at least two delay times;

calculating a measured time based on a plurality of digital codes generated by the time digital converter;

counting a count number of each of the digital codes for each of the delay times;

summing up the count numbers of the digital codes having the same real time in consideration of the delay times; and calculating information about the lifetime of the light emission based on the measured time.

6. The light-emission-lifetime measurement device according to claim 1, wherein the time delay circuit is configured to delay the input of at least one of the first signal and the second signal to the time digital converter while chronologically switching the delay time selected from the plurality of delay times.

7. The light-emission-lifetime measurement device according to claim 1, wherein the time digital converter is configured to receive inputs of a plurality of second signals for an input of one first signal and output the digital code for the input of each second signal.

8. The light-emission-lifetime measurement device according to claim 1, wherein the time digital converter is configured to output the digital code for each signal pair.

9. The light-emission-lifetime measurement method according to claim 5, further comprising:

controlling an output of the light; and outputting a control signal as the first trigger signal.

10. The light-emission-lifetime measurement method according to claim 5, further comprising:

detecting the output light; and outputting a detection signal as the first trigger signal.

11. The light-emission-lifetime measurement method according to claim 5, further comprising:

delaying the input of at least one of the first signal and the second signal to the time digital converter while chronologically switching the delay time selected from the plurality of delay times.

12. The light-emission-lifetime measurement method according to claim 5, further comprising:

receiving inputs of a plurality of second signals for an input of one first signal; and outputting the digital code for the input of each second signal.

13. The light-emission-lifetime measurement method according to claim 5, further comprising:

outputting the digital code for each signal pair.

* * * * *